United States Patent
Lin (10) Patent No.: US 11,769,031 B2
(45) Date of Patent: Sep. 26, 2023

(54) RFID DEVICE

(71) Applicant: ASIA SMART TAG CO., LTD., Taichung (TW)

(72) Inventor: Lien-Feng Lin, Taichung (TW)

(73) Assignee: ASIA SMART TAG CO., LTD., Taichung (TW)

(*) Notice: Subject to any disclaimer, the term of this patent is extended or adjusted under 35 U.S.C. 154(b) by 125 days.

(21) Appl. No.: 17/351,323

(22) Filed: Jun. 18, 2021

(65) Prior Publication Data

US 2021/0397919 A1 Dec. 23, 2021

(30) Foreign Application Priority Data

Jun. 18, 2020 (TW) ................................ 109120665

(51) Int. Cl.
*G06K 19/06* (2006.01)
*G06K 19/077* (2006.01)
*H05K 1/18* (2006.01)
*H05K 3/00* (2006.01)
*H05K 3/28* (2006.01)

(52) U.S. Cl.
CPC ....... *G06K 19/07728* (2013.01); *H05K 1/181* (2013.01); *H05K 3/0097* (2013.01); *H05K 3/284* (2013.01); *H05K 2201/10098* (2013.01); *H05K 2201/10545* (2013.01)

(58) Field of Classification Search
CPC ....... G06K 19/07749; G06K 19/07771; G06K 19/07; G06Q 10/08; G06Q 20/3278
USPC ............................... 235/492, 462.46, 472.02
See application file for complete search history.

(56) References Cited

U.S. PATENT DOCUMENTS

| 6,897,827 B2* | 5/2005 | Senba .............. G06K 19/07758 |
| | | 343/788 |
| 2018/0169917 A1* | 6/2018 | Chang ................. B29C 45/1671 |
| 2018/0218182 A1* | 8/2018 | Sugimoto .............. H05K 1/183 |

FOREIGN PATENT DOCUMENTS

| TW | 201933965 A | 8/2019 |
| TW | 1685287 B | 2/2020 |
| TW | 202009796 A | 3/2020 |

\* cited by examiner

*Primary Examiner* — Daniel St Cyr
(74) *Attorney, Agent, or Firm* — MUNCY, GEISSLER, OLDS & LOWE, P.C.

(57) ABSTRACT

The present invention disclosed a radio-frequency identification (RFID) device. The RFID device comprises a protective body and a RFID circuit unit located inside the protective body. The RFID circuit unit comprises a printed circuit board (PCB), a RFID chip and an antenna disposed thereon. A front surface of the PCB faces a top surface of the protective body; a rear surface of the PCB faces a bottom surface of the protective body.

13 Claims, 8 Drawing Sheets

RFID DEVICE

BACKGROUND OF THE INVENTION

1. Field of the Invention

The present invention relates to a radio frequency identification (RFID) device, particularly an RFID device suitable for being mounted on metal objects.

2. Description of the Related Art

One of the tasks relating to the mounting of an RFID tag on a metal object is how to reduce metal interference, or, in other words, to enhance the electromagnetic induction capability or reception capability of the RFID tag. Regarding such task, the inventor has proposed an RFID device suitable for metal objects as claimed in TW Patents No. 1685287 and No. 202009796. However, the inventor has been seeking to enhance the electromagnetic induction capability or transceiving capability of the induction coil of the RFID device.

SUMMARY OF THE INVENTION

It is an object of the present invention to solve at least the problems in the conventional technology.

The present invention provides a RFID device comprising a protective body having a top surface, a bottom surface, and a cylindrical surface located between the top surface and the bottom surface. The RFID device further comprises a RFID circuit unit located inside the protective body and comprising a printed circuit board (PCB) as well as a RFID chip and an antenna disposed thereon. The PCB has a front surface, a rear surface, a first side edge and an opposing second side edge. The front surface of the PCB is facing the top surface of the protective body; the rear surface of the PCB is facing the bottom surface of the protective body. The antenna is located on the front surface of the PCB. Preferably, the antenna is an induction coil, the induction coil having a first side surface and an opposing second side surface, the first side surface facing the top surface of the protective body, and the second side surface facing the front surface of the PCB. Preferably, the gap between the first side surface of the induction coil and the top surface of the protective body is less than or equal to 1 or 0.5 mm.

The antenna of the present invention may be an induction coil which has a first side surface and an opposing second side surface; the first side surface facing the top surface of the protective body, and the second side surface facing the front surface of the PCB.

In one embodiment, the first side edge of the PCB faces the cylindrical surface of the protective body without being exposed on the cylindrical surface of the protective body, and the second side edge of the PCB is exposed on the cylindrical surface of the protective body. In another embodiment, the first side edge or the second side edge of the PCB is exposed on the cylindrical surface of the protective body. Preferably, the first side edge and the second side edge of the PCB are exposed on the cylindrical surface of the protective body respectively.

In one embodiment, the cylindrical surface of the protective body also comprises a fracture surface, the fracture surface being located above and close to the second side edge of the PCB.

In addition, the protective body of the present invention also comprises an inner protective body enclosing the RFID chip, and an outer protective body enclosing the inner protective body, the printed circuit and the induction coil. The inner protective body is made with insulating glue, and the outer protective body is made of plastic or rubber.

In one embodiment, the RFID chip of the present invention is located on the rear surface of the PCB, and the RFID circuit unit comprises a ferrite core secured on the front surface of the PCB. The ferrite core comprises a middle connecting column and two side blocks connected individually to each end of the middle connecting column, the induction coil being located between the two side blocks and wrapping around the middle connecting column, each end of the induction coil being connected individually to tin solders on the two side blocks, the ferrite core being welded onto the front surface of the PCB via said tin solders.

In one embodiment, the induction coil has a third side surface and an opposing fourth side surface, the third side surface being adjacent to the first side surface, the second side surface being adjacent to the third side surface and standing opposite to the first side surface, the fourth side surface being adjacent to the second side surface and standing opposite to the third side surface, the third side surface and the fourth surface facing individually the cylindrical surface of the protective body, wherein the first side surface is wider than the third side surface. Furthermore, the diameter of the bottom surface of the protective body is less than the diameter of the top surface of the protective body.

In another embodiment, wherein the protective body comprises a lower portion near the bottom surface of the protective body that tapers downwardly, and an upper portion near the top surface of the protective body that receives the entire RFID circuit unit.

The foregoing and other objectives, features, and advantages of the invention will be more readily understood upon consideration of the following detailed description of the invention, taken in conjunction with the accompanying drawings.

DETAILED DESCRIPTION OF EMBODIMENTS

Figure 1:
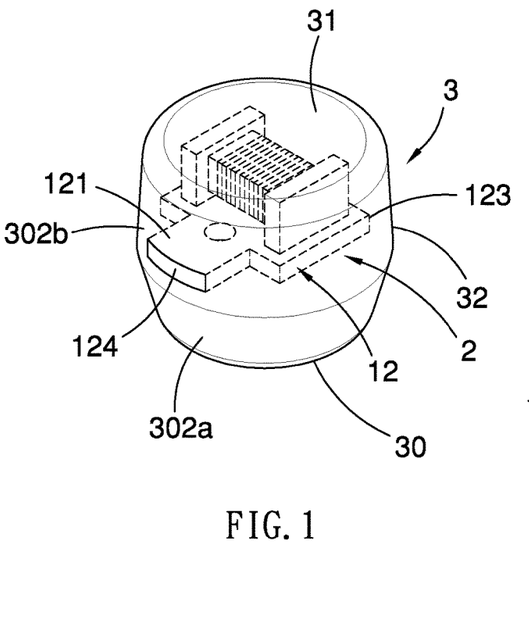
FIG. 1 is a perspective view of an RFID device in accordance with a preferred embodiment of the present invention.
Figure 2:
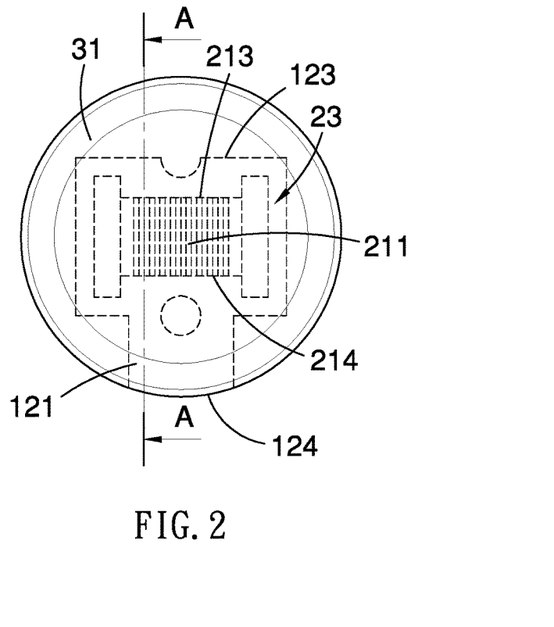
FIG. 2 is a top view of the preferred embodiment of the present invention.

Referring to FIGS. 1 and 2, there is shown an RFID device in accordance with a preferred embodiment of the present invention, which comprises a protective body 3 and a RFID circuit unit 2 contained therein. The protective body 3 has a bottom surface 30, a top surface 31 and a cylindrical surface 32 that is located between the bottom surface 30 and the top surface 31. In this embodiment, the diameter of the bottom surface 30 of the protective body 3 is less than the diameter of the top surface 31 of the protective body 3.

Figure 6:
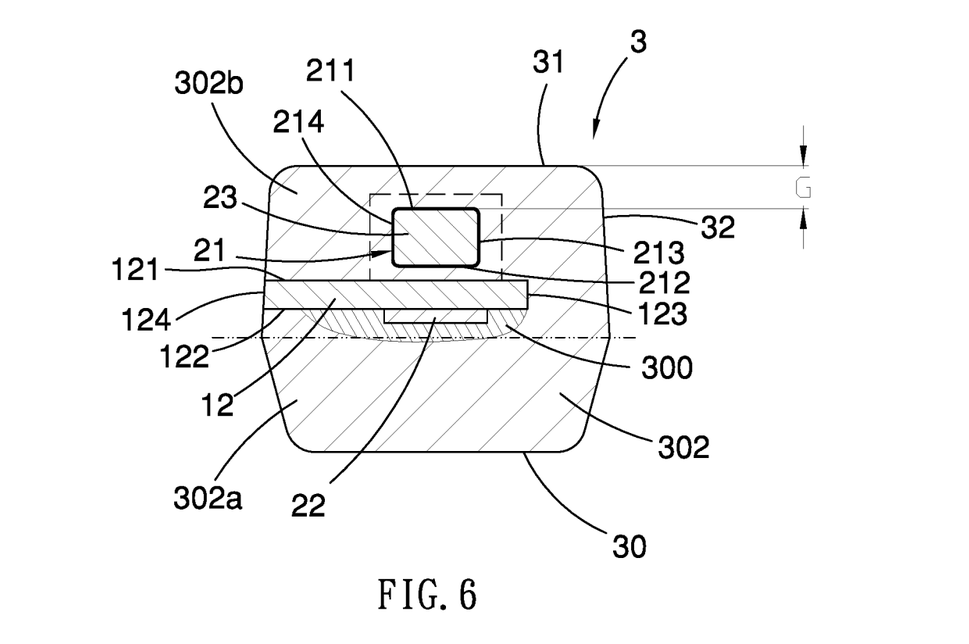
FIG. 6 is a section A-A of the preferred embodiment of the present invention.

As shown in FIGS. 1 and 6, the protective body 3 comprises a lower portion 302a near the bottom surface 30 of the protective body 3 that tapers downwardly, and an upper portion 302b near the top surface 31 of the protective body 3 that receives the entire RFID circuit unit 2.

Figure 3:
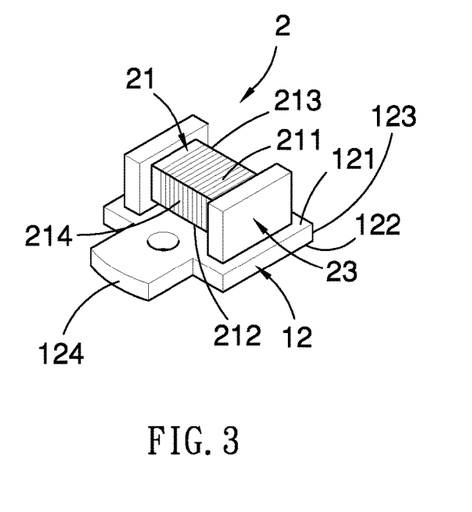
FIG. 3 is a perspective view of an RFID circuit unit in accordance with the preferred embodiment of the present invention.
Figure 4:
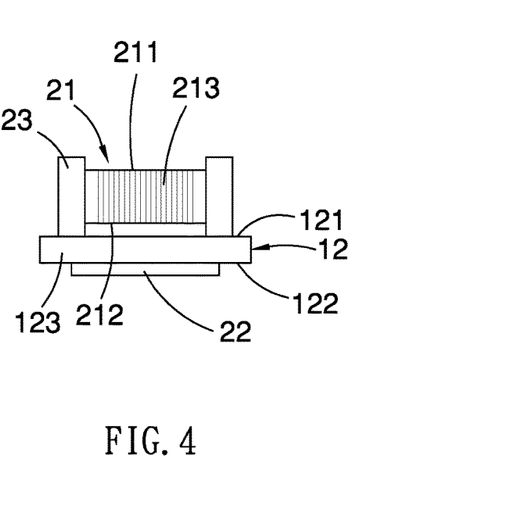
FIG. 4 is a back view of the RFID circuit unit of the present invention.
Figure 5:
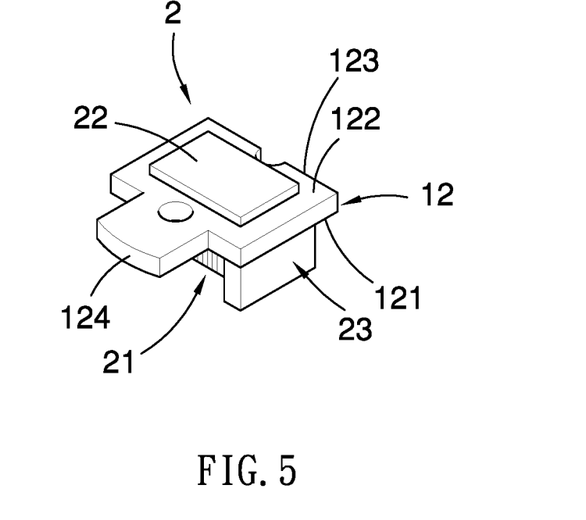
FIG. 5 is another perspective view of the RFID circuit unit of the present invention.

As shown in FIGS. 3-5, the RFID circuit unit 2 comprises a printed circuit board (PCB) 12 and an induction coil 21. The PCB 12 has a front surface 121, a rear surface 122, a first side edge 123 and an opposing second side edge 124.

The induction coil 21, which can be regarded as an antenna, is disposed on the front surface 121 of the PCB 12, and has a first side surface 211 and an opposing second side surface 212, as well as a third side surface 213 and an opposing fourth side surface 214. The third side surface 213 is adjacent to the first side surface 211. The second side surface 212 is adjacent to the third side surface 213 and stands opposite to the first side surface 211. The fourth side surface 214 is adjacent to the second side surface 212 and stands opposite to the third side surface 213. The first side surface 211 of the induction coil 21 and the front surface 121 of the PCB 12 face the same direction, the second side surface 212 faces the front surface 121 of the PCB 12, and the fourth side surface 214 and the second side edge 124 of the PCB 12 face the same direction. In this embodiment, the first side surface 211 has the same length and width as the second side surface 212, the third side surface 213 has the same length and width as the fourth side surface 214, the third side surface 213 has the same length as the first side surface 211, and the third side surface 213 has a width less than that of the first side surface 211. In other words, the first side surface 211 of the induction coil 21 is wider than both the third side surface 213 and the fourth side surface 214.

In this embodiment, as shown in FIG. 3, the RFID circuit unit 2 comprises an RFID chip 22 that is disposed on a rear surface 122 of the PCB 12. In addition, the RFID circuit unit 2 can also include a ferrite core 23, and, as shown in FIG. 2, the ferrite core 23 is disposed on the front surface 121 of the PCB 12, the induction coil 21 wrapping around the ferrite core 23. The RFID chip 22 is a low, medium or high-frequency RFID chip that can be selected from NXP Semiconductors' high-frequency RFID chips such as I-Core-SLI, NTag213, NTag215, NTag216 and Mifare, from STMicroelectronics's high-frequency RFID chips such as ST25TV512, ST25TV02K and ST25TV16K, from Temic's low-frequency RFID chips such as T5777 and T5778, or from EM-manufactured low-frequency RFID chips such as EM4102, EM4200 and EM4069. In this embodiment, a 13.56 MHz high-frequency RFID chip is used.

In this embodiment, as shown in FIG. 6, the protective body 3 also includes an inner protective body 300 enclosing the RFID chip 22, and an outer protective body 302 enclosing the inner protective body 300. The inner protective body 300 is made with insulating glue. The outer protective body 302 is made of non-conductive materials, preferably of plastic or rubber, such as being made of plastic materials that are heat-resistant up to around 200° C. by means of injection molding. In this embodiment, the material of the outer protective body 302 can be selected from plastic materials, such as ABS, PP, PE, PPN and glass-fiber-filled polyimides (such as PA6 GF30).

Furthermore, as shown in FIG. 6, the front surface 121 of the PCB 12 faces the top surface 31 of the protective body 3, the rear surface 122 of the PCB 12 faces the bottom surface 30 of the protective body 3, the first side edge 123 of the PCB 12 faces the cylindrical surface 32 of the protective body 3, the first side surface 211 of the induction coil 21 faces the top surface 31 of the protective body 3, the second side surface 212 of the induction coil 21 faces the front surface 121 of the PCB 12, and the third side surface 213 and the fourth side surface 214 of the induction coil 21 face the cylindrical surface 32 of the protective body 3, respectively. Given that the RFID circuit unit 2 can be disposed horizontally or obliquely inside the protective body 3, said term "faces" is not limited to the situations as shown in the drawings, but also includes "faces in an oblique manner."

Figure 7:
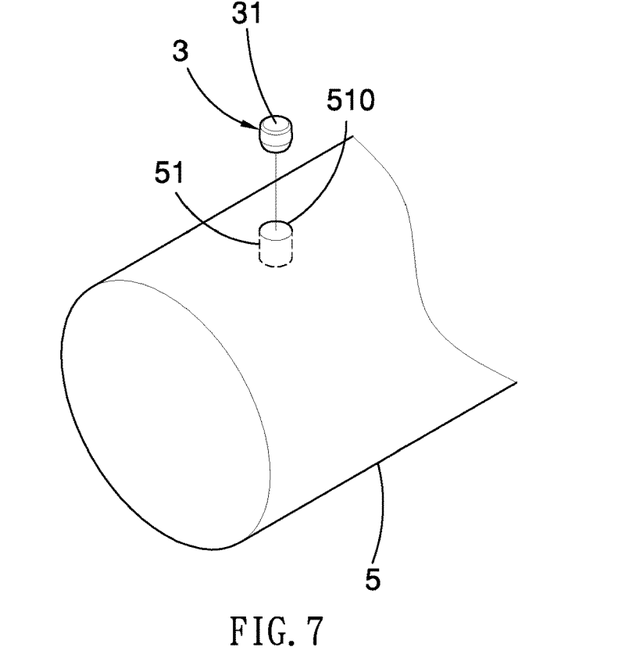
FIGS. 7 and FIG. 8 illustrate the use of the preferred embodiment of the present invention on a metal object.
Figure 8:
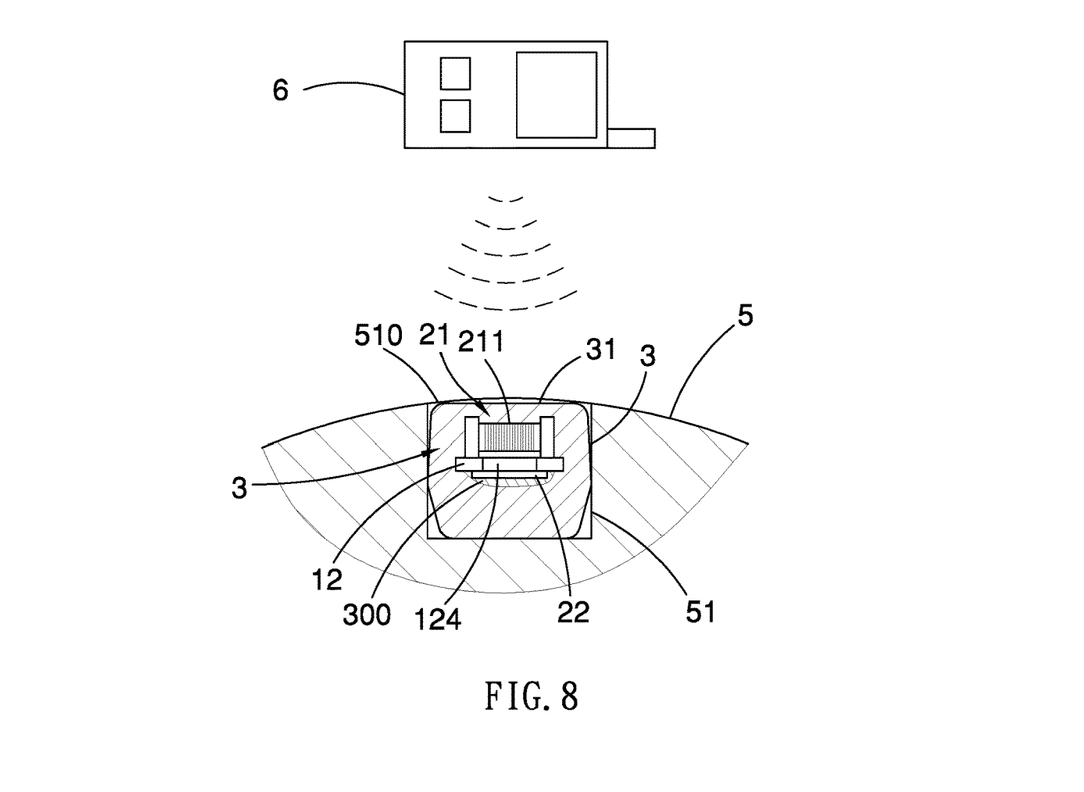

As shown in FIGS. 7 and 8, the RFID device of the present invention is inserted into a cavity 51 of an object 5 when used. The object can have a metal surface or can be but not limited to metal. For example, the object can be wooden or plastic. As such, the first side surface 211 of the induction coil 21 faces an opening 510 of the cavity 51; in other words, the first side surface 211 of the induction coil 21 faces the exterior of the object 5 so that it is easy for an RFID reader 6 to be inductively coupled with the RFID chip 22. In this embodiment, the first side surface 211 of the induction coil 21 is the widest among all surfaces and faces outwardly, which enhances the induction capability (or transceiving capability) of the induction coil 21 towards electromagnetic signals. Given that the object 5 has a metal surface or is metal, enhancement of induction capability of the induction coil 21 is equivalent to reduction of metal interference, which can ensure that the RFID reader 6 reads normally the RFID chip 22 while cases of reading failure or reading error can be reduced.

Figure 9:
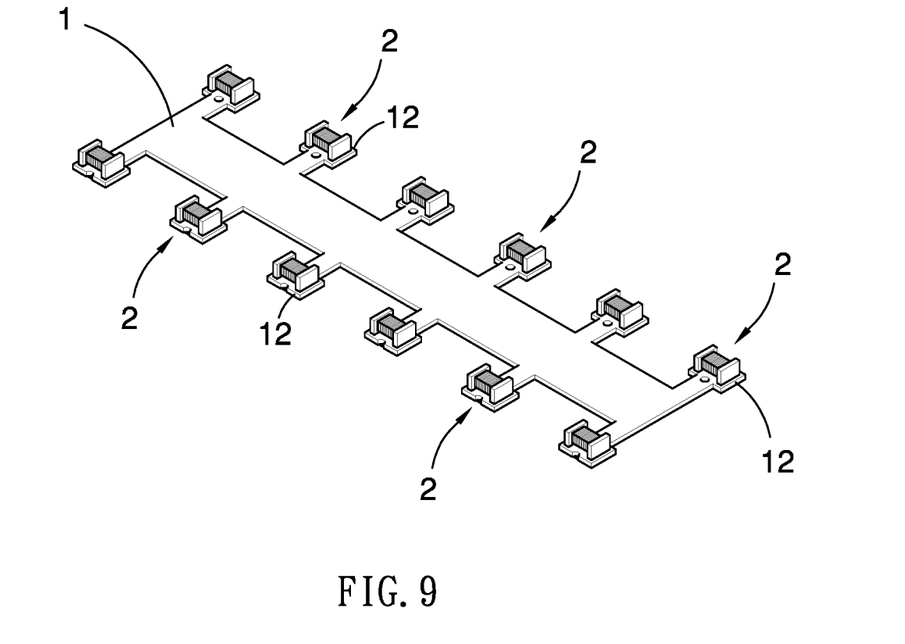
FIGS. 9 and FIG. 10 illustrate a substrate used for producing the preferred embodiment, as well as the states thereof before and after a process of encapsulation.
Figure 10:
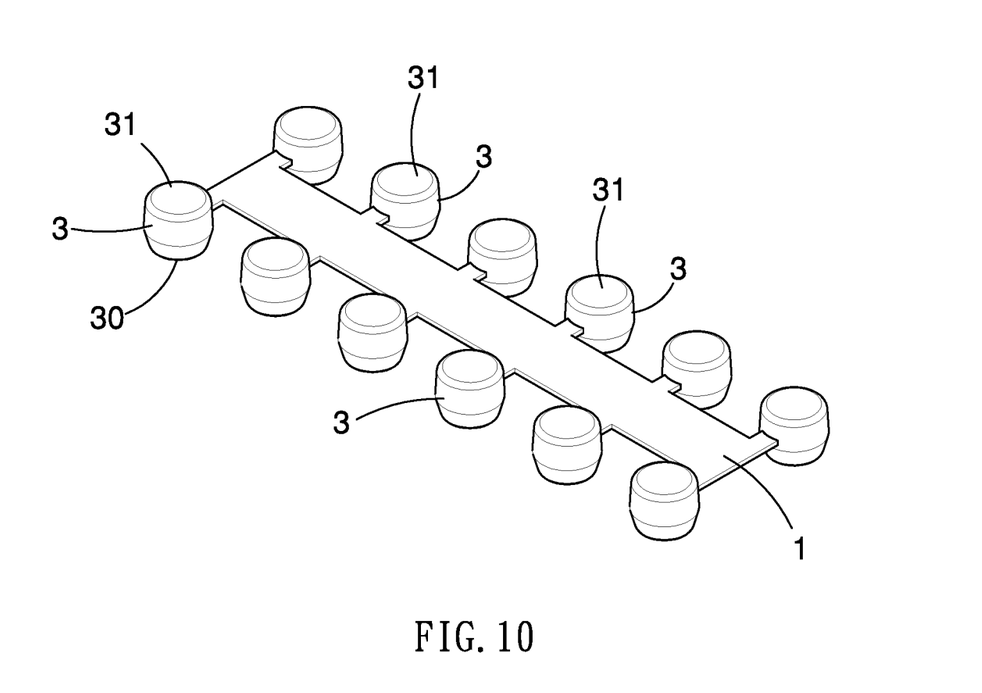

As shown in FIG. 10, two opposite edges of a substrate 1 protrude over multiple RFID circuit units 2 described herein. The PCB 12 of each RFID circuit unit 2 is part of the substrate 1, which was manufactured during a PCB manufacturing process. Said RFID chip 22 and ferrite core 23 (already wrapped around by the induction coil 21) are welded onto each PCB 12 as shown in this figure, so as to obtain the substrate 1 as shown in FIG. 10. Next, an encapsulation process is carried out, during which insulating glue is applied over the RFID chip 22 to form said inner protective body 300, and each RFID electric unit 2 is then covered with plastic materials individually by means of plastic injection molding to form said outer protective body 302. As a result, each RFID circuit unit 2 on the substrate 1 is enclosed individually by said protective body 3, and, as shown in FIG. 9, the cylindrical surface 32 of each protective body 3 is connected to the substrate 1. The PCB 12 of each protective body 3 is then disconnected from the substrate 1, so as to obtain multiple RFID devices as shown in FIGS. 1 and 6. Also, the second side edge 124 on the PCB 12 of each RFID device is exposed on the cylindrical surface 32 of the outer protective 302 of the protective body 3.

Figure 11:
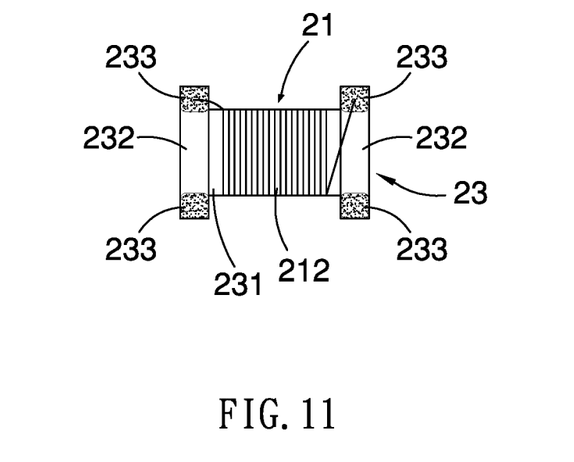
FIG. 11 is a bottom view of a ferrite core and induction coil of the preferred embodiment of the present invention.

In this embodiment, the ferrite core 23 is an I-shaped ferrite core. As shown in FIG. 11, the ferrite core 23 comprises a middle connecting column 231 and two side blocks 232 that are connected to each end of the middle connecting column 231, respectively. The induction coil 21 is located between the two side blocks 232 and surrounds the middle connecting column 231. Each of the two ends of the induction coil 21 is connected to tin solders 233 on the two side blocks 232, respectively. The ferrite core 23 is welded onto two solder pads (not shown in FIG. 11) on the front surface 121 of the PCB 12 via said tin solders 233, thereby being secured onto the front surface 121 of the PCB 12 and electrically connecting the induction coil 21 to the RFID chip 22.

Figure 12:
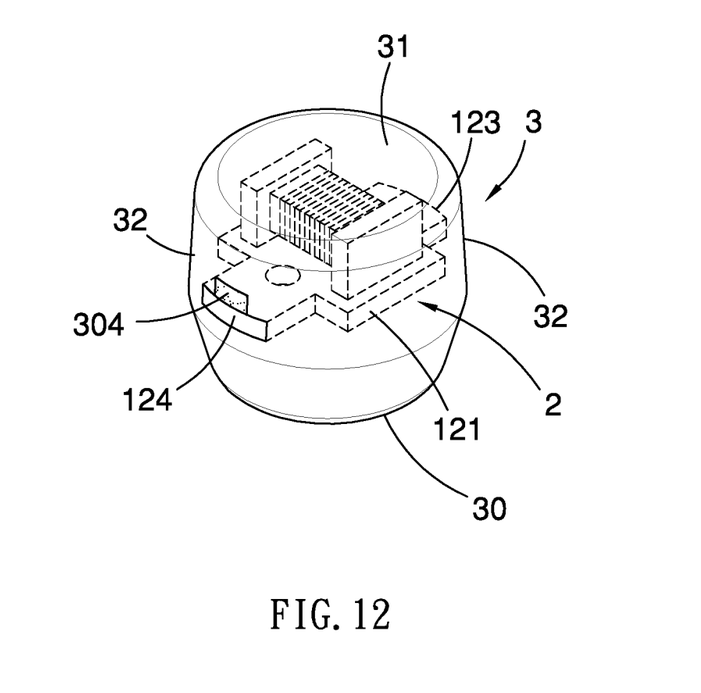
FIG. 12 is a perspective view of another preferred embodiment of the RFID device of the present invention.
Figure 13:
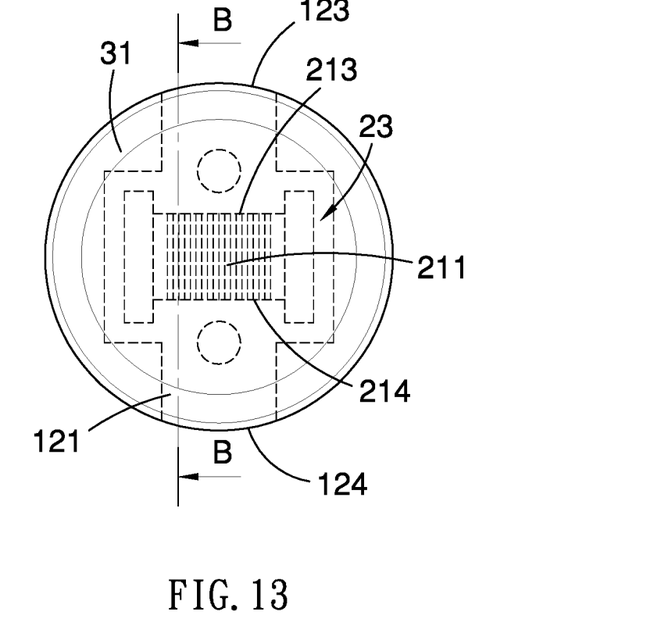
FIG. 13 is a bottom view of said another preferred embodiment of the present invention.
Figure 14:
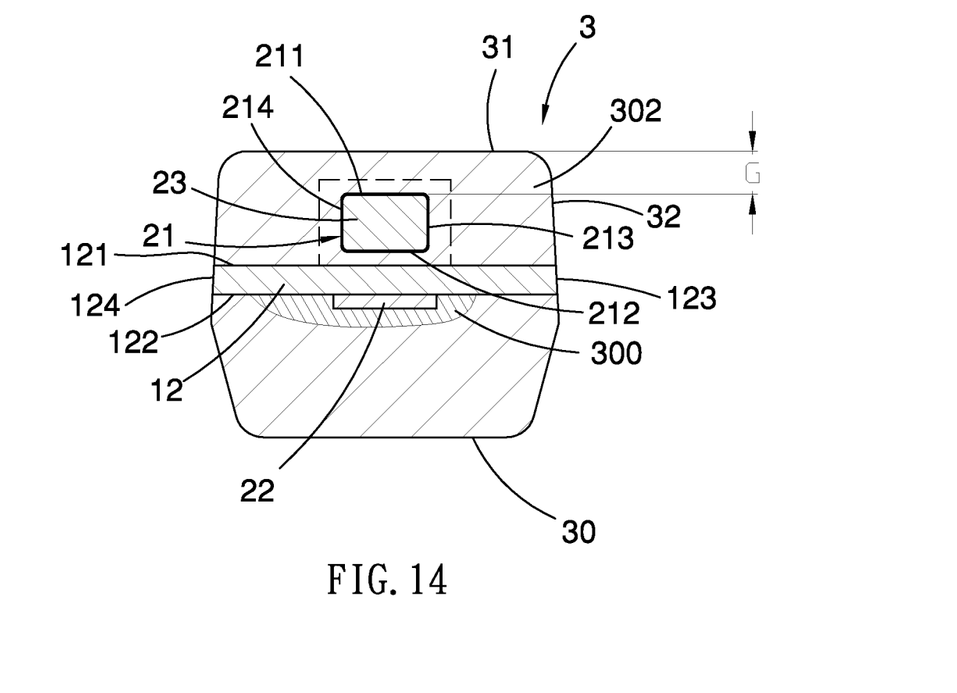
FIG. 14 is a section B-B of said another preferred embodiment of the present invention.
Figure 15:
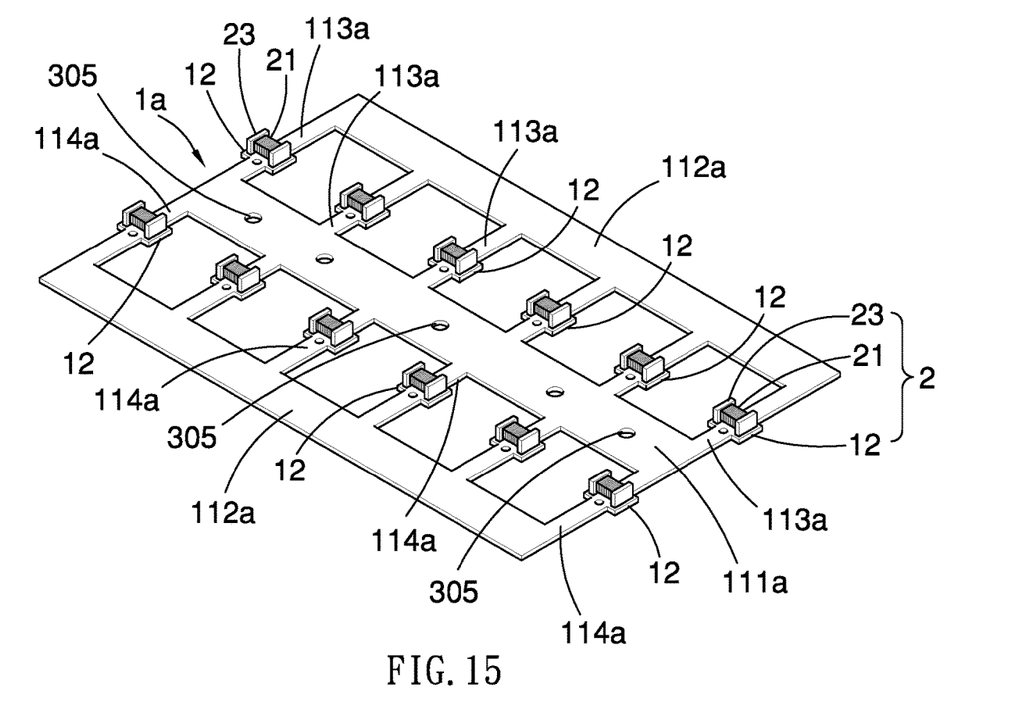
FIGS. 15-17 illustrate a production process of said another preferred embodiment of the present invention.
Figure 16:
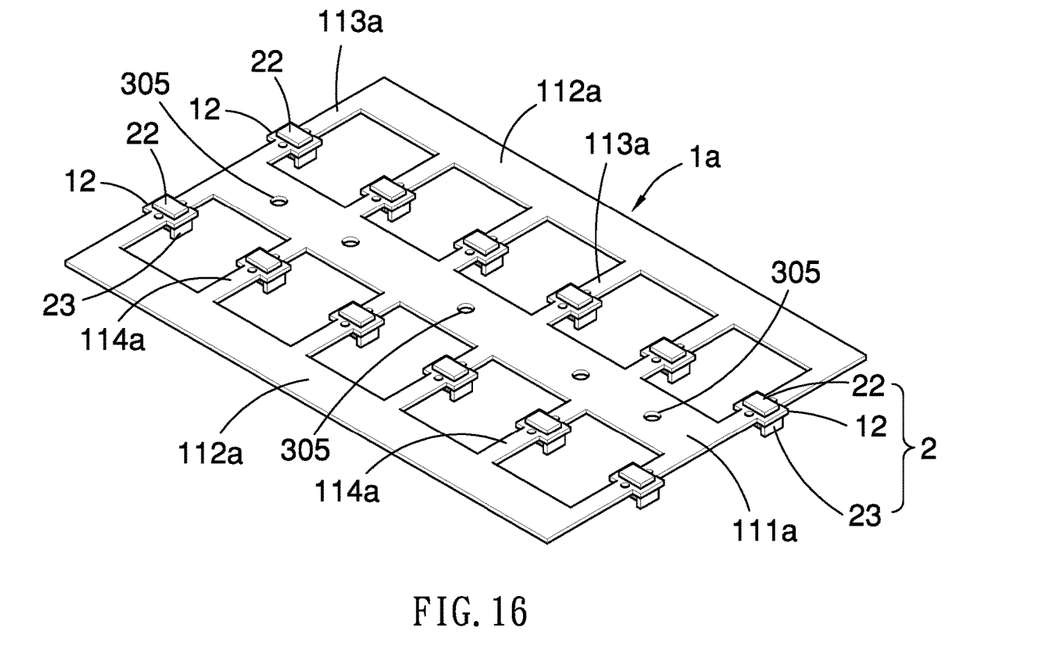
Figure 17:
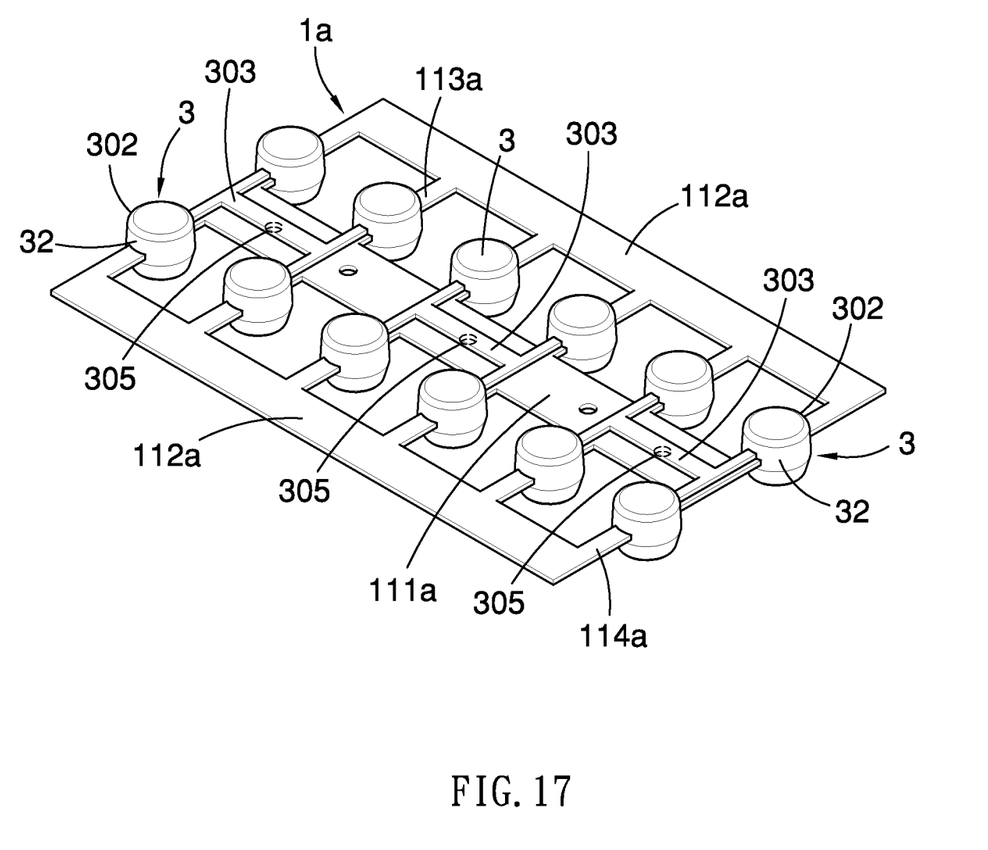

FIGS. 12 to 14 illustrate another preferred embodiment of the RFID device of the present invention, which is roughly identical to the above-mentioned embodiment. The two embodiments differ in that the second side edge 124 of the PCB 12 is exposed on the exterior of the cylindrical surface 32 of the protective body 3, and that the first side edge 123 of the PCB 12 is also exposed on the cylindrical surface 32 of the protective body 3. Such differences are mainly due to the fact that the substrate 1a of said another preferred embodiment is not the same as that of the above-mentioned embodiment. Specifically, as shown in FIGS. 15 and 16, the substrate 1a was manufactured via a manufacturing process of PCB and the PCB 12 of each RFID circuit unit 2 is part of the substrate 1. The substrate 1a comprises a mezzanine board 111a, two side boards 112a located individually on two opposite edges of the mezzanine board 111a, multiple first connecting bars 113a that connect the mezzanine board 111a and one of the two side boards 112a, and multiple second connecting bars 114a that connect the mezzanine board 111a and the other side board 112a. Each of the first connecting bars 113a has a wider portion serving as the PCB 12, and each of the second connecting bars 114a also has a wider portion serving as the PCB 12. One of said ferrite cores 23 and one of said RFID chips 22 are disposed individually on the front and rear surfaces of each PCB 12, each ferrite core 23 wrapping around one said induction coil 21. As such, each PCB 12 as well as the induction coil 21, the RFID chip 22 and the ferrite core 23 thereon constitute an RFID circuit unit 2. Each RFID chip 22 is covered with insulating glue to form said inner protective body 300, and each RFID electric unit 2 is then covered with plastic materials individually by means of plastic injection molding to form said outer protective body 302. As such, each RFID circuit unit 2 on the substrate 1a is enclosed by said protective body 3 individually, and as shown in FIG. 17, the cylindrical surface 32 of each protective body 3 is connected to the substrate 1a. Each PCB 12 is then disconnected from the substrate 1a, so as to obtain multiple RFID devices as shown FIGS. 12 to 14. Both the first side edge 123 and second edge 124 of the PCB 12 of each RFID device are exposed on the cylindrical surface 32 of the protective body 3.

In said another embodiment, when each outer protective body 302 is formed by means of injection molding, a framework 303 is also formed with said plastic materials, so that each outer protective body 302 is connected to the framework 303. When each PCB 12 is disconnected from the substrate 1a, each outer protective body 302 is also disconnected from the framework 303, so as to leave a fracture surface 304 on each protective body 3, the fracture surface 304 being located above and close to the second side edge 214 of the PCB 12.

Said configuration of the substrate 1a ensures that no skewing occurs on the PCB 12 during the process of said injection molding, whose mechanism is described as follows. When the substrate 1a on which said RFID circuit unit 2 is disposed is inserted into a plastic injection mold (not shown in the drawings), the mezzanine board 111a and two side boards 112a will be clamped by an upper molding die and lower molding die after clamping of said plastic injection mold, so that the substrate 1a is kept stable and horizontal. When being filled into the plastic injection mold, melted plastic materials pass through through-holes 305 on the substrate 1a and flow into each mold cavity through the inner flow channel of the plastic injection mold, each mold cavity being used for molding a corresponding outer protective body 302. Once said plastic injection molding is complete, the substrate 1a already connected to multiple protective bodies 3 can be taken out from the plastic injection mold, as shown in FIG. 17. The shape of each framework 303 is formed by the inner flow channel of the plastic injection mold, and each framework 303 is connected to, including without limitation four protective bodies 3.

In addition, to provide the induction coil 21 with a better electromagnetic induction capability (or reception capability), the gap G between the first side surface 211 (i.e. the top surface) of the induction coil 21 and the top surface 31 of the protective body 3 is less than or equal to 1 mm, preferably less than or equal to 0.5 mm.

What is claimed is:

1. An RFID device, comprising:
a protective body having a top surface, a bottom surface, and a cylindrical surface located between the top surface and the bottom surface; and
an RFID circuit unit located inside the protective body and comprising a printed circuit board (PCB), a ferrite core, an RFID chip and an induction coil, the PCB having a front surface, a rear surface, a first side edge and an opposing second side edge, the front surface of the PCB facing the top surface of the protective body, the rear surface of the PCB facing the bottom surface of the protective body, the ferrite core being welded onto the front surface of the PCB, the induction coil being located on the ferrite core, the RFID chip being welded onto the rear surface of the PCB;
wherein the induction coil has a first side surface and an opposing second side surface, the first side surface faces the top surface of the protective body, and the second side surface faces the front surface of the PCB.

2. The RFID device as recited in claim 1, wherein the first side edge of the PCB faces the cylindrical surface of the protective body without being exposed on the cylindrical surface of the protective body, and the second side edge of the PCB is exposed on the cylindrical surface of the protective body.

3. The RFID device as recited in claim 1, wherein the first side edge of the PCB is exposed on the cylindrical surface of the protective body.

4. The RFID device as recited in claim 1, wherein the second side edge of the PCB is exposed on the cylindrical surface of the protective body.

5. The RFID device as recited in claim 4, wherein the cylindrical surface of the protective body further comprises a fracture surface, the fracture surface being located above and close to the second side edge of the PCB.

6. The RFID device as recited in claim 1, wherein the first side edge and the second side edge of the PCB are exposed on the cylindrical surface of the protective body respectively.

7. The RFID device as recited in claim 6, wherein the cylindrical surface of the protective body further comprises a fracture surface, the fracture surface being located above and close to the second side edge of the PCB.

8. The RFID device as recited in claim 1, wherein a gap between the first side surface of the induction coil and the top surface of the protective body is less than or equal to 1 mm.

9. The RFID device as recited in claim 1, wherein a gap between the first side surface of the induction coil and the top surface of the protective body is less than or equal to 0.5 mm.

10. The RFID device as recited in claim 1, wherein the protective body comprises an inner protective body enclosing the RFID chip, and an outer protective body enclosing the inner protective body, the printed circuit and the induction coil, the inner protective body being made with insulating glue, and the outer protective body being made of plastic or rubber.

11. The RFID device as recited in claim 1, wherein the ferrite core comprises a middle connecting column and two side blocks connected individually to each end of the middle connecting column, the induction coil being located between the two side blocks and wrapping around the middle connecting column, each end of the induction coil being connected individually to tin solders on the two side blocks, the ferrite core being welded onto the front surface of the PCB via said tin solders.

12. The RFID device as recited in claim 1, wherein the induction coil has a third side surface and an opposing fourth side surface, the third side surface being adjacent to the first side surface, the second side surface being adjacent to the third side surface and standing opposite to the first side surface, the fourth side surface being adjacent to the second side surface and standing opposite to the third side surface, the third side surface and the fourth surface facing individually the cylindrical surface of the protective body, wherein the first side surface is wider than the third side surface.

13. The RFID device as recited in claim 1, wherein a diameter of the bottom surface of the protective body is less than a diameter of the top surface of the protective body, wherein the protective body comprises a lower portion near the bottom surface of the protective body that tapers downwardly, and an upper portion near the top surface of the protective body that receives the entire RFID circuit unit.

\* \* \* \* \*